United States Patent [19]

Uchiyama et al.

[11] Patent Number: 5,281,547

[45] Date of Patent: Jan. 25, 1994

[54] METHOD FOR MANUFACTURING A FIELD EFFECT TRANSISTOR

[75] Inventors: Akira Uchiyama; Takahisa Hayashi; Toshiyuki Ochiai, all of Tokyo, Japan

[73] Assignee: Oki Electric Industry Co., Ltd., Tokyo, Japan

[21] Appl. No.: 778,986

[22] PCT Filed: Mar. 28, 1990

[86] PCT No.: PCT/JP90/00416

§ 371 Date: Nov. 12, 1991

§ 102(e) Date: Nov. 12, 1991

[87] PCT Pub. No.: WO90/13918

PCT Pub. Date: Nov. 15, 1990

[30] Foreign Application Priority Data

May 12, 1989 [JP] Japan ................... 1-118893

[51] Int. Cl.$^5$ ........................................... H01L 21/265
[52] U.S. Cl. ........................................ 437/41; 437/203
[58] Field of Search ............... 357/23.1, 23.4.23.9, 357/42; 437/41, 203

[56] References Cited

U.S. PATENT DOCUMENTS

| | | | |
|---|---|---|---|
| 4,455,740 | 6/1984 | Iwai | 437/67 |
| 4,649,627 | 3/1987 | Abernathey et al. | 357/23.1 |
| 4,649,638 | 3/1987 | Fang et al. | 29/590 |
| 4,835,584 | 5/1989 | Lancaster | 357/23.1 |
| 4,910,564 | 3/1990 | Inoue | 357/42 |
| 4,933,734 | 6/1990 | Inoue | 357/23.4 |
| 4,967,257 | 10/1990 | Inoue | 357/23.1 |
| 4,996,574 | 2/1991 | Shirasaki | 357/23.1 |

FOREIGN PATENT DOCUMENTS

| | | | |
|---|---|---|---|
| 8603341 | 5/1986 | European Pat. Off. | 357/23.1 |
| 59-228762 | 12/1984 | Japan | 357/23.1 |
| 61-18175 | 1/1986 | Japan | 357/23.4 |
| 61-241978 | 10/1986 | Japan | 357/23.4 |
| 62-126675(A) | 8/1987 | Japan | |
| 64-8670 | 1/1989 | Japan | 357/23.1 |
| 1-8670 | 1/1989 | Japan | 357/23.1 |
| 64-9662 | 1/1989 | Japan | 357/23.4 |
| 64-32667(A) | 2/1989 | Japan | |
| 64-32677 | 2/1989 | Japan | 357/23.1 |
| 64-61060 | 2/1989 | Japan | 357/23.1 |
| 1-183855 | 7/1989 | Japan | 357/23.1 |
| 1-276669 | 11/1989 | Japan | 357/23.1 |

OTHER PUBLICATIONS

A Model for the Trench Transistor, S. Banerjee et al., IEEE Transactions on Electron Devices, vol. ED-34, No. 12, Dec. '87, pp. 2485-2492.

IBM Technical Disclosure Bulletin, vol. 29, No. 10, Mar., 1987, "Trench Mosfets (3D Structure)", pp. 4305-4307.

IEEE Transactions on Electron Devices, vol. ED-34, No. 12, Dec. 1987, "A Model for the trench transistor", by Banerjee et al., pp. 2485-2492.

*Primary Examiner*—Brian E. Hearn
*Assistant Examiner*—Linda J. Fleck
*Attorney, Agent, or Firm*—Wenderoth, Lind & Ponack

[57] ABSTRACT

A field effect transistor of the present invention has in a base layer (33) a difference in levels constituted by an upper main surface (35a) a wall surface (35b) and a lower main surface (35c), the wall surface (35b) having a gate insulating film (39) and a gate electrode (41) in a sequential order at least in a direction extending from the upper main surface (35a) to the lower main surface (35c), the wall surface (35b) being provided, on both sides of the portions thereof corresponding to the gate insulating film (39) and gate electrode (41), with inpurity diffusion regions for forming of source and drain, respectively.

Accordingly, the gate electrode (41) is provided in a manner that the gate width which needs to have a relatively large size is set in a direction vertical to the upper main surface of the base layer. This makes it possible to improve the degree of integration effectively.

2 Claims, 5 Drawing Sheets

Fig. 3A PRIOR ART
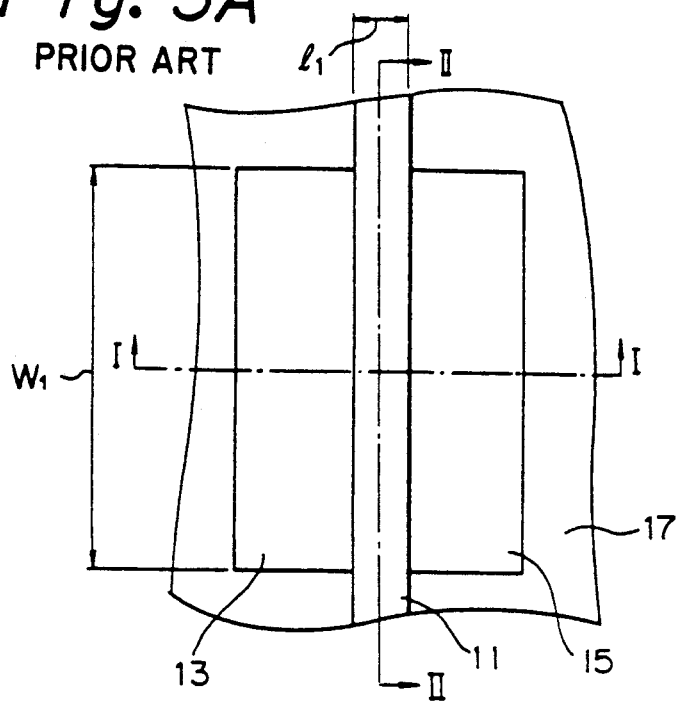
Fig. 3B PRIOR ART
Fig. 3C PRIOR ART
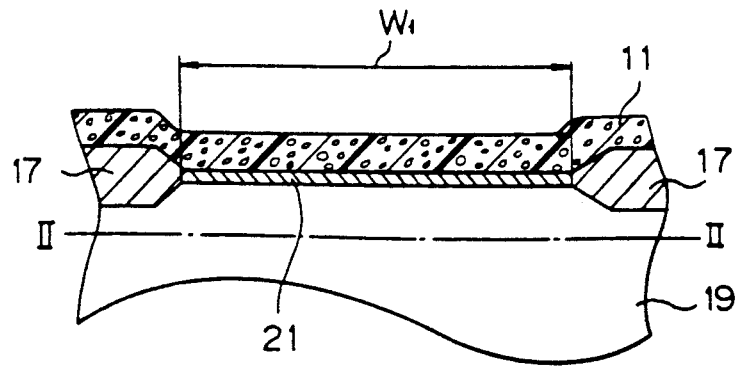

METHOD FOR MANUFACTURING A FIELD EFFECT TRANSISTOR

TECHNICAL FIELD

The present invention relates to a method for manufacturing a field effect transistor (hereinafter referred in some cases to simply as "FET" (: Field Effect Transistor) which is suitably used with respect to various LSIs (: Large Scale Integrated Circuit). More particularly, the invention relates to a technology improving the degree of integration by utilizing a wall which extends between the two surface levels involved in the base layer.

BACKGROUND TECHNOLOGY

To increase the degree of integration of LSIs, it is necessary to reduce the area occupied on the main surface of the substrate by the individual semiconductor elements which constitute an LSI.

FIG. 3(A) to 3(C) are schematic views illustrating a conventionally most widely known structure of MOS (Metal Oxide Semiconductor) type FET (hereinafter referred in some cases to simply as "MOSFET"). Namely, FIG. 3(A) is a plan view, as taken from above, of an essential portion of the semiconductor device; FIG. 3(B) is a sectional view taken along the one-dot chain line I—I of FIG. 3(A); and FIG. 3(C) is a sectional view taken along the one-dot chain line II—II of FIG. 3(A). In these Figures, only one element is shown and the hatching, etc. indicating sectional views are partially omitted. Further, in order to make it easier to understand the following descriptions, impurity diffusion regions for forming source and drain are referred as a "source region" and a "drain region" which are shown in a specified disposition relationship. However, this disposition relationship is only illustrative. Therefore, the function of the element is not impaired whatsoever even when the illustrated dispositions of the two regions have been reversed.

As well known, the MOSFET structure shown in these figures is the most basic structure among those of conventional elements, in which the voltage applied to a gate electrode 11 is used as a control signal for electrically switching a current passing between a source region 13 and a drain region 15.

First, as shown in FIG. 3(A), the gate electrode 11 is formed with a width W1 corresponding to disposition dimension of one element and is also formed with a length l1 in the shape of a stripe. Each element is electrically isolated from another by means of a field oxide film 17.

As shown in FIGS. 3(B) and 3(C), the element of this type uses a substrate 19 made of silicon, as a base layer, the above-mentioned gate electrode 11 being disposed on this substrate 19 via a gate insulating film 21. The above-mentioned source region 13 and drain region 15 are provided as independent constituent elements, respectively, on both sides of the gate electrode 11 (and the gate insulating film 21).

Usually, the gate length l1 is set at approximately 0.5 to 1.0 ($\mu$m). Since the electric current passing between the source and the drain corresponding to the driving ability of the element is in proportional relation to the gate width W1, it is considered to be optimal that this width W1 is approximately ten times as large as the gate length l1, in consideration of the operating speed of the element. Accordingly, the width W1 is set at approximately 5 to 10 ($\mu$m).

With an increase in the degree of integration of LSI, an attempt has been made to decrease the gate length l1 and the gate width W1. However, since both the l1 and W1 are set by utilizing the main surface of the substrate as the base layer in a two-dimensional manner, dimensional decreasing of the l1 and W1 is limited when considering that the above-mentioned driving ability and operating speed of the element should be maintained.

Under the above-mentioned existing circumstances, various proposals have been made as to the technology improving the degree of integration without impairing the function of the element. For instance, Japanese Laid Open Patent Publication No. 61-206253 discloses a technique enlarging the surface area effective to form the element by three-dimensional utilization of the base layer.

Another prior art technique disclosed in this publication will hereinafter be described with reference to the drawings.

FIG. 4 is a schematic perspective view of an essential portion of the element, which is intended to illustrate the above mentioned another prior art technique and in which hatching, etc. indicating sectional views are partially omitted. It is to be noted that FIG. 4 shows a structure of one MOSFET only although the above mentioned publication discloses a CMOS (Complementary MOS) in which two MOSFETs of different conductivity types are combined together into one device.

As will be seen in this FIG. 4, a difference in levels involving an upper main surface 23a, a wall surface 23b and a lower main surface 23c are formed in the substrate 19 in advance. The MOSFET is structured by utilizing this difference in levels. Usually, a groove or a trench formed in the main surface (corresponding to the upper main surface 23a) of the substrate 19 serving as the base layer is utilized for providing this difference in levels. The illustrated difference in levels is one of four levels which constitute such a groove. Accordingly, when forming a CMOS, a pair of opposing wall surfaces among a plurality of wall surfaces constituting the groove are utilized to form two MOSFETs, respectively.

To further explain the structure of the above-mentioned MOSFET, a gate insulating film 25 is formed on the wall surface 23b of the illustrated difference in levels. Further, a gate electrode 27 which is electrically isolated from the substrate 19 by the gate insulating film 25 is provided in such a manner as to diminish the difference in levels.

Furthermore, a source region 29 and a drain region 31 are formed in the substrate 19 in such a manner that respective diffusion depths thereof extend in a direction perpendicular to the wall surface 23b.

As will be seen in FIG. 4 as well, in case of this structure of the device, the gate width W2 is set in parallel with the main surface of the substrate, as in case of the device structure of which explanation has been made with reference to FIGS. 3(A) to 3(C).

On the other hand, the gate length l2 is set in a direction vertical to the main surface of the substrate by utilizing the above-mentioned difference in levels. For this reason, the wall surface 23b of the difference in levels is employed to form the element, so that it becomes possible to enlarge the surface area effectively.

However, in the above-mentioned prior art technique utilizing the difference in levels, the gate width W2 which necessitates approximately ten times larger size as the gate length 12 is set in parallel with the main surface of the substrate serving as the base layer, so that the effect of enlarging the surface area in a direction of thickness (direction vertical to the main surface) of the substrate by providing a difference in levels is relatively small, resulting in an insufficient increase in the degree of integration for FETs.

Besides, when studying the FET of FIG. 4 illustrated as a conventional structure from the standpoint of manufacturing process, there is a problem that, in the case of forming, by a conventionally most widely used ion implantation, the impurity diffusion regions used for forming source and drain such as the source region 29 and the drain region 31, performing of the process step involved becomes complicated.

In more detail, when performing ion implantation with respect to the upper main surface 23a, this surface 23a is damaged during the forming of the drain region 31 located deeply in the substrate 19 as the base layer.

Further, when forming the above-mentioned impurity diffusion regions by ion implantation with respect to the wall surface 23b from an oblique direction, it is necessary to form on the wall surface 23b an ion implantation mask extending in parallel with the main surface of the substrate. In case of the most typical element structure shown in FIGS. 3(A) to 3(C), the gate electrode is usually utilized for such a mask to form the impurity diffusion region by self alignment. In case of the element structure shown in FIG. 4, however, it is substantially difficult to form on the wall surface 23b a stripe-shaped mask extending in a direction parallel to the main surface. In addition, although the dimension of overlap region between the impurity diffusion region and the gate electrode needs to be controlled with high precision since the gate length decreases, it is impossible to control the dimension of overlap region vertically to the main surface.

Further, although no illustration is made in FIG. 4, when disposing electrodes, respectively, with respect to the two impurity diffusion regions for forming source and drain, the electrodes connected to the impurity diffusion regions formed in the substrate must be drawn out, respectively, through, for example, the groove formed in the lower main surface 23c in the vicinity thereof. Accordingly, in this electrode formation as well, a problem arises that the process step involved becomes complicated.

The object of the present invention, in view of the above-described conventional problems, is to provide the structure of a semiconductor element capable of improving the degree of integration of the field effect transistors by utilizing a difference in levels formed in the base layer, which can be realized by employing a simplified manufacturing process.

DISCLOSURE OF THE INVENTION

To accomplish the above object, the present invention provides a field effect transistor having a base layer formed a difference in levels therein involving an upper main surface, a wall surface and a lower main surface, the wall surface having a gate insulating film and a gate electrode, sequentially in this order, in a direction extending from the upper main surface to the lower main surface, the wall surface having impurity diffusion regions for forming source and drain, respectively, on both sides of the gate insulating film and gate electrode.

According to the field effect transistor of the present invention, the gate width, among the gate length and gate width, which should be made relatively larger is set in a direction vertical to the main surface of the base layer. Therefore, it is possible to effectively improve the degree of integration of FETs.

Further, with this construction, since the impurity diffusion regions for forming source and drain are respectively provided on both sides of the gate electrode extending in a direction height of the difference in levels, simplification of the manufacturing process can be readily realized.

BRIEF DESCRIPTION OF THE DRAWINGS

FIGS. 3(A) to 3(C) are explanatory views illustrating a related prior art technique.

BEST MODE FOR CARRYING OUT THE INVENTION

An embodiment of the present invention will now be described with reference to the drawings. It is firstly to be noted in advance that the drawings to which the following description will be made are schematical illustrations only made to such an extent as would make the understanding of the invention easier, and that, therefore, it should be appreciated that the invention is not limited at all to such illustrations. It is also to be noted that the descriptions and illustrations of the following embodiment are directed to a case where the structure of the invention is applied to a MOSFET which employs a silicon substrate.

Figure 1A:
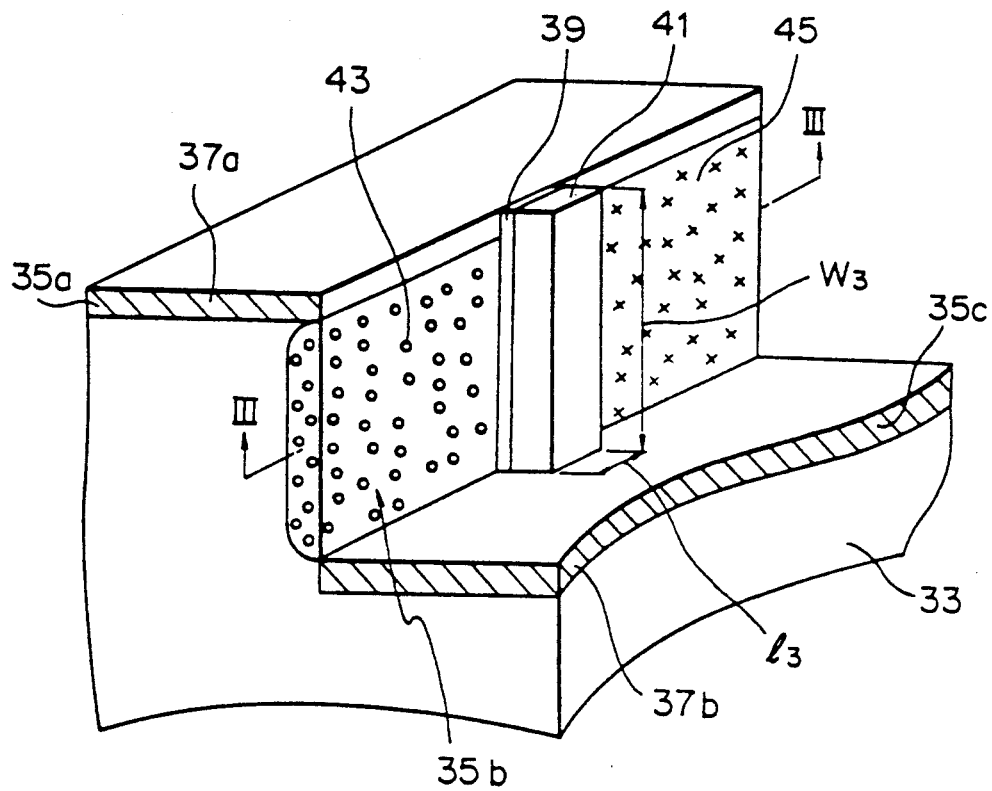
FIG. 1(A) is a schematic perspective view showing one example structure of a field effect transistor in accordance with an embodiment of the present invention.
Figure 1B:
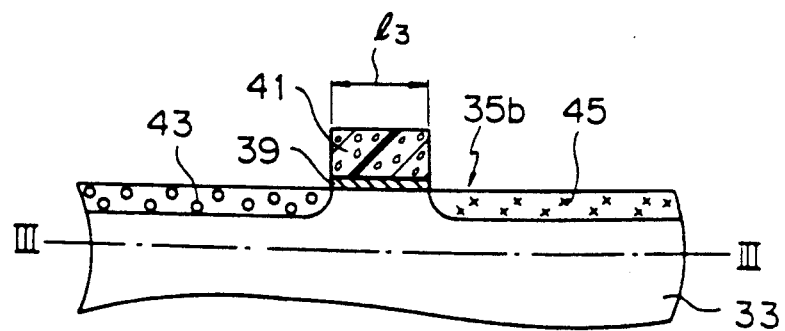
FIG. 1(B) is a schematic sectional view of a specified portion of the field effect transistor shown in FIG. 1(A)

FIGS. 1(A) and 1(B) are explanatory views illustrating the MOSFET structure according to this embodiment of the invention, FIG. 1(A) being a schematic perspective view directed to one MOSFET and used to show the structure as a whole, FIG. 1(B) being a schematic sectional view taken along the one-dot chain line III—III of FIG. 1(A). In these figures, hatchings, etc. indicating section or flat surfaces, used to make it easier to understand the illustrations are only used with respect to part of the constituent components.

As shown in the figures, a substrate 33 consisting of silicon, having an n or p conductivity type and serving as a base layer is formed with an upper main surface 35a, a wall surface 35b and a lower main surface 35c.

The upper main surface 35a and the lower main surface 35c are covered with a silicon oxide film 37a or 37b.

The wall surface 35b is sequentially covered with a gate insulating film 39 formed of silicon oxide and a gate electrode 41 in this order, in a direction extending from the upper main surface 35a to the lower main surface 35c, in other words, in a direction of thickness of the substrate 33.

Further, the wall surface 35b is formed, on both sides of the portions thereof corresponding to the gate insulating film 39 and the gate electrode 41, with a source region 43 and a drain region 45 constituting the impurity diffusion regions for forming source and drain, respectively. Note that the dispositions of these impurity diffusion regions are equivalent to each other and, in hence, the illustrated dispositions of the source region and drain region may be reversed.

In this structure of the MOSFET according to this embodiment, the gate width as indicated with symbol W3 is set in a direction vertical to the main surface of the substrate 33 (the thickness-wise direction of the substrate 33). Accordingly, by making greater the depth of the difference in levels, it is possible to set the gate width W3 greatly affecting the driving ability of the element, the gate width W3 suitably having a value ten times as great as that of the gate length 13, without being followed by a decrease in the degree of integration.

Further, although, as in the prior art, no illustration is made to the electrodes which are respectively connected to the source region 43 and the drain region 45, as seen from FIG. 1(A) as well, these electrodes can be easily formed by utilizing a similar technique to that of the gate electrode 41.

Hereinafter referring to the attached drawings, one example of the manufacturing process for obtaining a MOSFET structure in accordance with this embodiment will be explained.

Figure 2A:
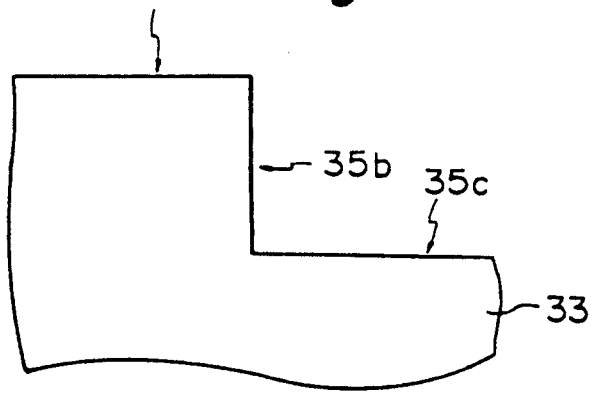
FIGS. 2(A) to 2(F) are views which illustrate for each process step an example of the manufacturing process for the field effect transistor shown in FIGS. 1(A) and 1(B)
Figure 2B:
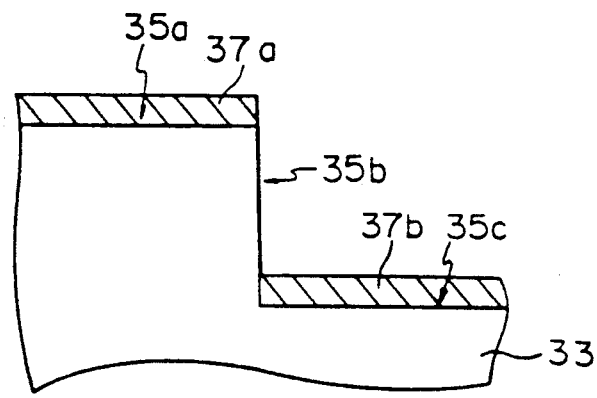
Figure 2C:
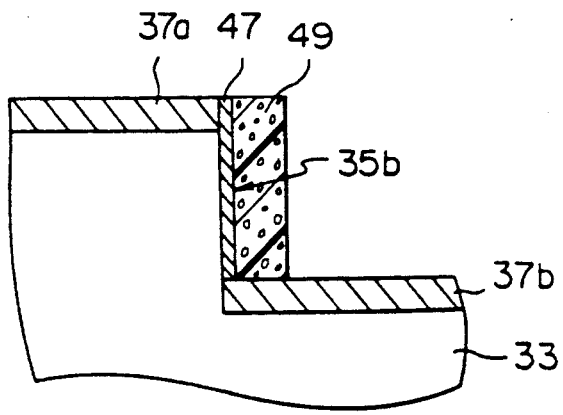
Figure 2D:
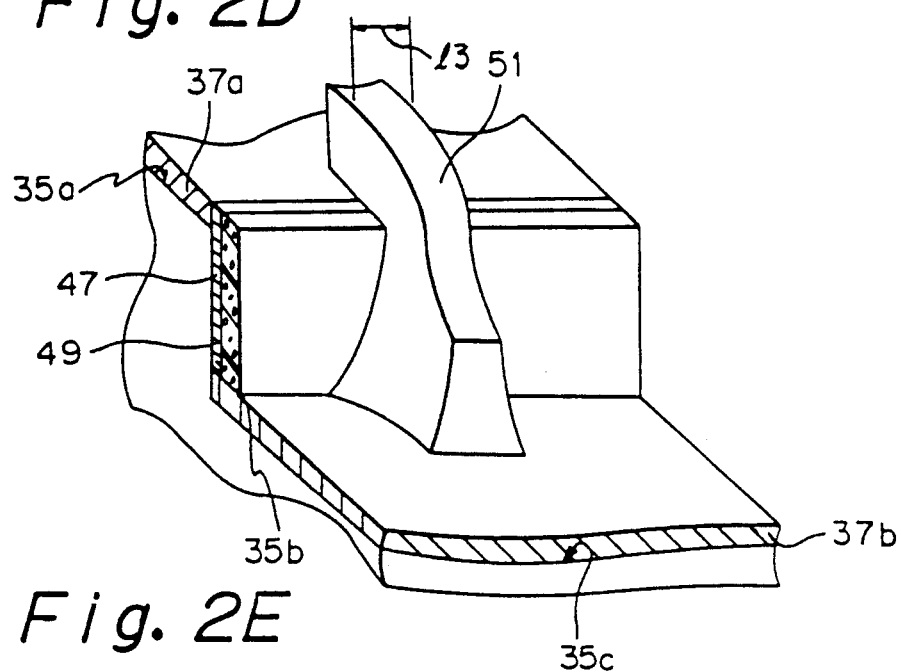
Figure 2E:
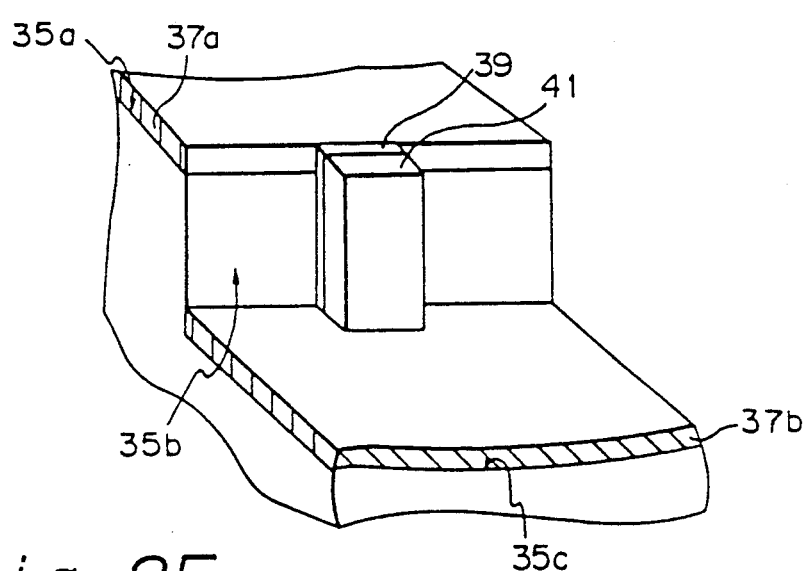

FIGS. 2(A) to 2(E) are respective schematic explanatory views illustrating, for each process step, the main manufacturing process steps for a MOSFET in accordance with this embodiment. Among these figures, FIGS. 2(A) to 2(C) and 2(F) are sectional views each taken along a plane vertical to the wall surface 35b, some of which views include the gate electrode 41 while FIGS. 2(D) and 2(E) are exploded perspective views of the essential portion of the element, directing mainly to the aforementioned wall surface 35b.

First of all, an etching mask (not shown) constituted by, for example, a resist pattern is provided on the specified portion of the substrate 33 at which a MOSFET is desired to be formed. Thereafter, a groove is formed by utilizing an anisotropic etching technique such as a reactive ion etching (RIE). This groove is so formed as to have a depth equal to the gate width W3 shown in FIG. 1(A).

As a result, as shown in FIG. 2(A), a step is constructed having an upper main surface 35a corresponding to the main surface of the original substrate 33, a wall surface 35b and a lower main surface 35c newly formed by the above-mentioned etching.

Subsequently, the substrate is subjected to thermal oxidation treatment in such a manner that the wall surface 35b is covered with a anti-oxidation mask (not shown) made of, for example, silicon nitride and having a thickness of approximately 0.3 ($\mu$m). Then, the anti-oxidation mask is removed to obtain a silicon oxide film 37b adhering to the lower main surface 35c as well as a silicon oxide film 37a adhering to the upper main surface 35a.

Hereinafter, the patterning step for the above-mentioned gate insulating film 39 and the gate electrode 41 will be explained. In this embodiment, the pattern-forming technology which is proposed in Japanese Patent Application No. 63-331809 by the invertor of the application is employed as one example of the patterning technique for the above-mentioned film 39 and electrode 41.

Firstly, thermal oxidation treatment is again performed with respect to the substrate 33 obtained as mentioned above to grow a material film 47 made of silicon oxide for forming a gate insulating film on the entire wall surface 35b with a thickness of approximately 3 to 20 (nm).

Subsequently, a polycrystalline silicon film doped with, for example, a p or n conductivity type impurities to decrease its resistivity, refractory metal film composed of various silicides, or a film having polycide structure produced by laminating these materials, are adhered onto the entire surface of the substrate 33. Thereafter, such electrically conductive film is treated by anisotropic etching to form a material film 49 for gate electrode which is only adhered onto the wall surface 35b and which has a thickness of approximately 0.1 to 0.5 ($\mu$m).

Subsequently, as shown in FIG. 2(D) which is a perspective view of an essential portion of the element directed solely to the wall surface 35b, a mask is applied to a specified portion of the wall surface 35b desired to be formed with a gate electrode. Then, a resist pattern 51 having a width equal to the above-mentioned gate length 13 is formed on the upper main surface 35a. As will be understood in FIG. 2(D) as well, although the resist pattern 51 on the upper main surface 35a is formed with a dimension as predetermined, the resist pattern 51 on the wall surface 35b and the lower main surface 35c is formed with a dimension which is slightly different from the above-mentioned dimension as predetermined.

However, if anisotropic etching is performed using the above-mentioned resist pattern 51 as a mask, the constituent components adhered onto the wall surface 35b will be sequentially etched from the side of the upper main surface 35a to the width 13 of the resist pattern 51. For this reason, by using this patterning technique, it is possible to simultaneously form the stripe-shaped gate electrode 41 and gate insulating film 39 substantially having a gate length 13 as shown in FIG. 2(E).

Figure 2F:
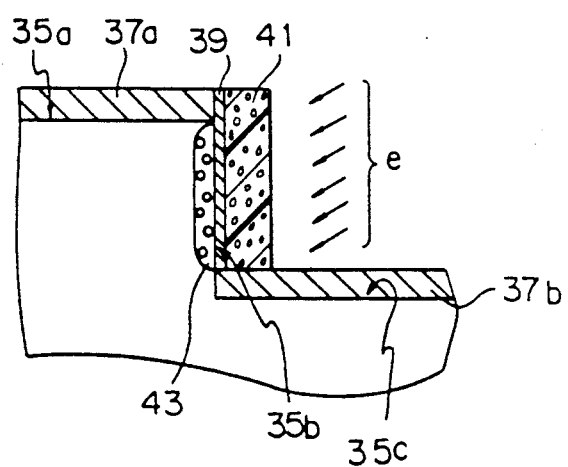
Figure 4:
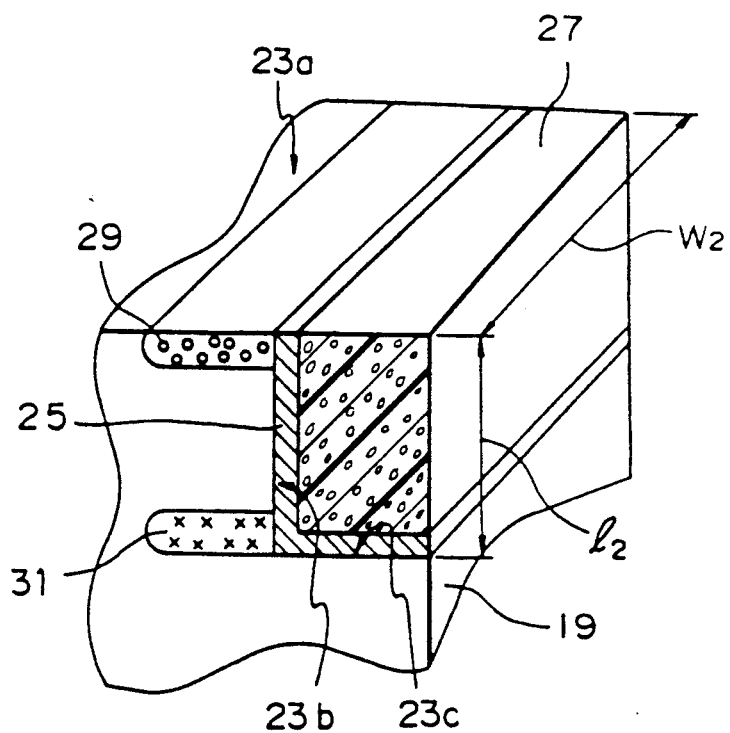
FIG. 4 is a view illustrating another prior art technique which uses a difference in levels.

Subsequently, the impurity ions having a conductivity type different from that of the silicon substrate 33 which is illustrated with a character e in FIGS. 2(F) similar to that shown in FIGS. 2(A) to 2(C), are implanted from a direction oblique with respect to the wall surface 35b to achieve a concentration of approximately $10^{19}$ to $10^{20}$ (cm$^{-3}$). Consequently, the source region 43 and drain region 45, an explanation of which has been made with reference to FIGS. 1(A) and 1(B), are formed by utilizing self alignment technique with respect to the gate electrode 41 and the gate oxide film 39 (provided, however, that FIG. 2(F) shows only the source region 43).

Further, the electrodes omitted from the FIGS. 1(A) and 1(B) illustrations, which are respectively connected to the source region 43 and the drain region 45, can be easily formed by utilizing the patterning technique explained with reference to FIGS. 2(D) and 2(E).

Although the embodiment of the present invention has been described above in detail, it is also clear that the present invention is not limited to the above embodiment.

To make the understanding of the description easier, the embodiment has been described in regard only to the MOSFET formed at one difference in levels. However, similar advantages can be obtained by applying the structure of the present invention even in the case of CMOS type FETs having channels of different conductivity types. In this case, while, as explained above, differences in levels are formed by utilizing a groove formed in the substrate serving as a base layer, the CMOS may be structured by utilizing two opposing differences in levels of the groove or the trench.

In the above-mentioned embodiment, description has been made of the specific example of the manufacturing process to illustrate the structure provided with the gate electrode and gate insulating film substantially on the wall surface alone.

For instance, however, the invention may include a case where the structure is provided with a strip-shaped gate electrode in such a manner that it extends over a region covering the upper main surface, the wall surface and lower main surface.

Further, the above description has referred to MOS-FET not only in the invention but also in the prior art. However, the structure of the present invention makes it possible to obtain a similar effect of improving the degree of integration even when it is applied to MES (Metal Semiconductor) FET in which a GaAs substrate is used as a base layer.

Besides, the structure of the invention may employ a difference in levels obtained through growing of a specified epitaxial layer on the substrate, in place of the difference in levels formed in the substrate by etching as mentioned above.

It should also be apparent that the constituent-component material, dimensions, shapes, disposition relationship, and other conditions may arbitrarily be changed or modified without departing from the object of this invention.

INDUSTRIAL EFFECTS

As has been described above, according to the field effect transistor of the invention, the gate electrode is provided by setting the gate width required to have a larger size than the gate length in a direction vertical to the main surface of the base layer. Therefore, it is possible to effectively improve the degree of integration of the field effect transistors.

Further, according to the structure of the invention, the impurity diffusion regions for forming of source and drain are provided, respectively, on both sides of the gate electrode extending in the heightwise direction of the difference in levels. Therefore, the manufacturing process can be simplified as compared with the aforementioned prior art.

Accordingly, applying of this invention enables an increase in the degree of integration through utilizing of the difference in levels formed in the base layer and, in addition, enables provision of an FET structure capable of simplifying the manufacturing process. This leads to the possibility of expecting the provision of an LSI having excellent characteristics.

We claim:
1. A method for manufacturing a field effect transistor comprising steps in the following order of:
   (1) forming a difference in levels constituted by an upper main surface, a wall surface and a lower main surface in a semiconductor substrate;
   (2) forming an electrically conductive layer along an entire surface of said semiconductor substrate;
   (3) removing a portion of said electrically conductive layer other than a corresponding portion to said wall surface of said difference in levels by anisotropic etching;
   (4) forming a mask layer, in a direction from said upper main surface to said lower main surface, at a specified region of said electrically conductive layer remained on said wall surface;
   (5) selectively removing said electrically conductive layer by anisotropic etching performed from above said semiconductor substrate, with said mask layer used as a mask, thereby forming a gate electrode on said wall surface; and
   (6) performing impurity ion implantation with respect to said wall surface by using said gate electrode as a mask.

2. A method for manufacturing a field effect transistor comprising steps in the following order of:
   (1) forming a difference in levels constituted by an upper main surface, a wall surface and a lower main surface in a semiconductor substrate;
   (2) forming an oxide film on a surface of said wall surface through thermal oxidation;
   (3) forming an electrically conductive layer along an entire surface of said semiconductor substrate including said difference in levels;
   (4) removing a portion of said electrically conductive layer other than a corresponding portion to said wall surface of said difference in levels, by anisotropic etching;
   (5) forming a mask layer, in a direction from said upper main surface to said lower main surface, at a specified region of said electrically conductive layer remained on said wall surface;
   (6) selectively removing said electrically conductive layer and said oxide film by anisotropic etching performed from above said semiconductor substrate, with said mask layer used as a mask, thereby forming a gate oxide film and a gate electrode on said wall surface; and
   (7) performing impurity ion implantation with respect to said wall surface by using said gate electrode as a mask.

* * * * *